United States Patent
Kim et al.

(10) Patent No.: US 9,194,053 B2
(45) Date of Patent: Nov. 24, 2015

(54) SUBSTRATE CARRIER DEVICE FOR DOUBLE-SIDED ELECTROPLATING OF SOLAR CELL

(71) Applicant: HOJIN PLATECH CO., LTD., Ansan-Si (KR)

(72) Inventors: Pan Soo Kim, Yongin-Si (KR); Duk Haeng Lee, Bucheon-Si (KR); Woon Suk Jung, Ansan-Si (KR)

(73) Assignee: HOJIN PLATECH CO., LTD., Ansan-Si (KR)

( * ) Notice: Subject to any disclaimer, the term of this patent is extended or adjusted under 35 U.S.C. 154(b) by 0 days.

(21) Appl. No.: 14/127,971

(22) PCT Filed: Apr. 5, 2013

(86) PCT No.: PCT/KR2013/002830
§ 371 (c)(1),
(2) Date: Dec. 20, 2013

(87) PCT Pub. No.: WO2013/151365
PCT Pub. Date: Oct. 10, 2013

(65) Prior Publication Data
US 2015/0176148 A1    Jun. 25, 2015

(30) Foreign Application Priority Data

Apr. 5, 2012  (KR) .................. 10-2012-0035490

(51) Int. Cl.
| C25D 17/00 | (2006.01) |
| C25D 17/06 | (2006.01) |
| H01L 31/18 | (2006.01) |
| C25D 7/12  | (2006.01) |

(52) U.S. Cl.
CPC ............. *C25D 17/06* (2013.01); *C25D 7/126* (2013.01); *C25D 17/001* (2013.01); *H01L 31/18* (2013.01)

(58) Field of Classification Search
CPC ...... C25D 17/06; C25D 17/08; C25D 17/001; H01L 21/6734
USPC ............ 204/297.01, 297.06, 297.12, 297.14, 204/297.1
See application file for complete search history.

(56) References Cited

U.S. PATENT DOCUMENTS

| 4,796,157 A    | 1/1989  | Ostrem |
| 4,988,426 A *  | 1/1991  | Metzka ................ 204/297.08 |
| 5,580,432 A    | 12/1996 | Shibata et al. |
| 2005/0061665 A1 * | 3/2005 | Pavani et al. ............ 204/297.06 |
| 2012/0073974 A1 * | 3/2012 | Abas et al. .................. 205/80 |
| 2012/0073976 A1 | 3/2012 | Chen et al. |

FOREIGN PATENT DOCUMENTS

KR    10-2008-0034992 A    4/2008

* cited by examiner

*Primary Examiner* — Luan Van
*Assistant Examiner* — Alexander W Keeling
(74) *Attorney, Agent, or Firm* — Perkins Coie LLP

(57) ABSTRACT

Provided is a substrate carrier device for electroplating of a solar cell which simultaneously plates both surfaces of a wafer. The substrate carrier device 100 includes a wafer receiving area 105 having an opening-shaped area and supporting an edge of the wafer to be received through a plurality of first protrusion supporting parts 140 and a plurality of second protrusion parts 150 which are formed on an edge of the frame, clip mounting rods 106, 107, 108, and 109 installed on left and right sides of the wafer receiving area to control a clip opening (forming a contact point with the wafer) and a clip closing (releasing a contact point with the wafer) while rotating at a fixed position, a plurality of first clips 160 installed on the clip mounting rod, opening and closing of the plurality of first clips being determined by a rotation of the clip mounting rod, and a plurality of second clips 170 installed around the wafer receiving area 105 on a second surface of the frame to pass through a hole 151 defined in the second protrusion supporting part 150.

13 Claims, 5 Drawing Sheets

SUBSTRATE CARRIER DEVICE FOR DOUBLE-SIDED ELECTROPLATING OF SOLAR CELL

CROSS REFERENCE TO RELATED APPLICATIONS

This application is a 35 USC §371 National Stage application of International Application No. PCT/KR2013/002830 filed Apr. 5, 2013, which claims the benefit of priority to Korean Patent Application No. 10-2012-0035490 filed Apr. 5, 2012. The disclosure of each of the prior applications is considered part of and is incorporated by reference in the disclosure of this application.

TECHNICAL FIELD

The present invention relates to devices for supporting a plurality of semiconductor wafers to electroplate the plurality of semiconductor wafers to be used in a solar cell, and more particularly to a carrier device for a double-side electroplating.

BACKGROUND

Recently, there has been a growing interest in new and renewable energy due to a global environmental problem, depletion of fossil energy, waste disposal of nuclear power generation, and site selection for construction of new power plants, and the like. Most of all, research and development in the field of solar energy generation that is a non-polluting energy source is proceeding. The amount of energy that the Earth receives from the sun is about 10,000 times more than energy consumption on Earth.

Solar cells are devices for directly converting solar photovoltaic energy into electrical energy. The solar cells have difficulties in commercialization due to their economic feasibility. To replace the traditional generation means such as fossil energy and the like, solar energy should be more economical or be economically competitive than the traditional generation means. Thus, techniques for solar energy are being focused on increasing generation efficiency as well as improving the economic feasibility thereof.

To manufacture such solar cells, a predetermined circuit should be formed on a wafer substrate. Electroplating is one of the potential methods for manufacturing solar cells. In the electroplating, an electroplating material is electroplated on a surface of an object located at a negative electrode by using the principle of electrolysis. Positively and negatively charged electrodes and an electrolyte solution are included as basic elements in an electrolytic-plating process. Also, a metal to be electroplated is present in the electrolyte in the form of ions. Generally, a process of immersing the wafer in a plating bath is performed. That is, to perform electroplating, the wafer is electroplated by immersing the wafer in an electroplating solution in a state where a predetermined jig holds the wafer. As described above, in an exemplary case of forming an electrode pattern through an electroplating process, delaminating a photoresist, and performing an etch back process, among various processes for manufacturing for the solar cells, a substrate carrier device for supporting and carrying a plurality of silicon wafers is essential.

However, it can take some time when the wafer is loaded and unloaded on/from the substrate carrier device. The time required to load and unload the wafer on/from the substrate carrier device has a large influence on productivity and economic feasibility of solar cell substrates. Therefore, techniques to quickly and stably load and unload more wafers on/from the carrier device are very important.

Generally, when the wafer substrate is loaded on and fixed to a supporting frame, numerous screws have been typically used or a clip has been used to fix the wafer one by one. Moreover, it can take a lot of time in the loading and unloading processes because the clips should be released one by one.

The present technology described in this patent document was a result of the research efforts by the inventors and can be used to addresse the above-described limitations.

SUMMARY

An object of the present invention is to provide a substrate carrier device for solar cell.

In one aspect, a substrate carrier device of the present invention can be used for a plating process for forming an electrode on double-sides of a wafer. When a wafer is loaded on and unloaded from a carrier device, the substrate carrier device of the present invention ensures that the wafer is easily attached to and detached from the carrier device. The carrier device saves time needed for an electroplating process, and thus may reduce manufacturing costs of solar cells. A plurality of wafers may be subject to an electroplating at the same time.

Other objects of the present invention that are not described in the description can be additionally considered in the scope of the present invention and can be easily construed by the following description and the effects of the present invention.

Embodiments of the present invention provide a substrate carrier device for the electroplating of a solar cell which simultaneously plates both surfaces of a wafer. In one example, the device includes: a frame in which a substrate is received; a supporting part connected to a transfer device; a wafer receiving area having an opening-shaped area defined in the frame and supporting an edge of the wafer to be received through a plurality of first protrusion supporting parts and a plurality of second protrusion parts which are formed on an edge of the frame; at least two clip mounting rods vertically mounted to traverse a first surface of the frame at left and right sides of the wafer receiving area to control a clip opening (forming a contact point with the wafer) and a clip closing (releasing a contact point with the wafer) while rotating at a fixed position; a plurality of first clips installed spaced apart by a predetermined distance from each other on the clip mounting rod, opening and closing of the plurality of first clips being determined by a rotation of the clip mounting rod; and a plurality of second clips installed around the wafer receiving area on a second surface of the frame to pass through a hole defined in the second protrusion supporting part and having ends disposed higher than a surface of the second protrusion supporting part.

In some embodiments, the device may further include a base on which the first and second protrusion supporting parts are formed, in which the base may further include an inclined surface formed from the frame toward the wafer receiving area to guide the wafer to the wafer receiving area through the inclined surface when the wafer is loaded on the substrate carrier device.

In other embodiments, upper ends of the clip mounting rods may be inserted into holes defined in upper end rod fixing parts and lower ends of the clip mounting rods may be inserted into holes defined in lower end rod fixing parts, and the upper ends may be connected to the upper end rod fixing parts by spring members and clip opening and clip closing of the clip mounting rods may be manipulated by using elastic power of the spring member.

In still other embodiments, handles for controlling a movement of the clip mounting rods may be installed on the upper ends of the clip mounting rods, respectively, and the spring member may be tightly wound around from the upper ends of the clip mounting rods to the handles.

In yet other embodiments, the first and second clips installed spaced by a predetermined distance from each other on the clip mounting rods may have a spring shape wound around the rods several times, and in which one ends of the clips may be fixed to the clip mounting rods(in the case of the first clip) or to a second surface of the frame (in the case of the second clip) by attachable/detachable clip fixing means, and the other ends of the clips may form contact points on both surfaces of the wafer, respectively.

In even other embodiments, portions in which the first and second clips form the contact points with the wafer may be doubly bent to have a U-shape.

In even other embodiments, positions in which the first and second clips form contact points with the wafer may be disposed in the same normal line direction when the surface of the wafer is used as a reference.

The disclosed implementation can release clips arranged in the same matrix at the same time by using a long rod element when a process of electroplating double-sides of a wafer at the same time is performed, e.g., such as electroplating double-sides of a wafer for a solar cell. Thus, when a wafer substrate is loaded on and unloaded from a supporting device, the wafer substrate may be easily detachable from the carrier device. Therefore, time and efforts required for electroplating may be reduced, and as a result, manufacturing costs of the solar cell may be reduced.

The effects expected to have ordinary and provisional effects by technical characteristics of the present invention can be regarded as the effects described in the description, although it is not described in detail in the present invention.

The exemplified accompanying drawings are used to illustrate the technical idea, thus, the scope of protective rights of the present invention shall not construed as being limited by the embodiments.

DETAILED DESCRIPTION

Hereinafter, embodiments of the present invention will be described in more detail with reference to the accompanying drawings. Moreover, detailed descriptions related to well-known functions or configurations obvious to those skilled in the art that the present invention will be ruled out in order not to unnecessarily obscure subject matters of the present invention.

Figure 1:
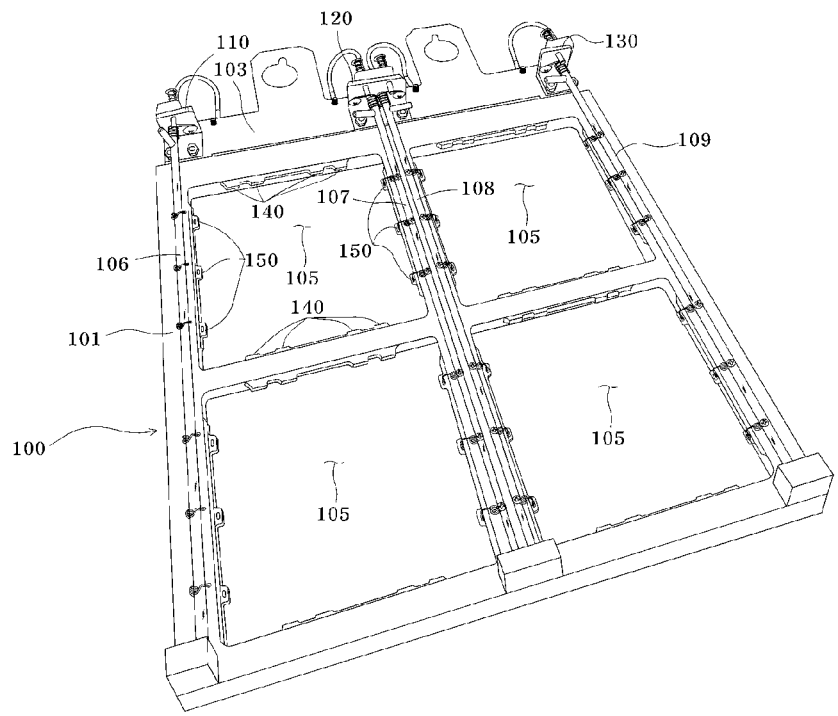
FIG. 1 is a perspective view of a substrate carrier device 100 according to an exemplary embodiment of the present invention.

FIG. 1 is a schematic view illustrating a substrate carrier device 100 of a substrate carrier for electroplating on double-sides of a wafer, e.g., such as a wafer for a solar cell, according to an embodiment of the present invention. The substrate carrier device 100 may be transferred in a state that a support unit 103 thereof is connected to a transfer device (not shown). Electroplating may be performed after the substrate carrier device 100 is introduced into a plating bath in which a plating solution is received. Well-known or various modified units may be used to connect the substrate carrier device 100 to the transfer device, and to perform electroplating.

As illustrated in FIG. 1, the substrate carrier device 100 includes wafer receiving areas 105 that include at least one repeated opening holes, a device frame 101 surrounding the wafer receiving area 105, and a supporting unit 103 connecting the device frame to a transfer device (not shown).

Wafers (not shown) are loaded on the wafer receiving areas 105 of the substrate carrier device 100, respectively. For example, a plurality of wafers forming a matrix may be arranged on the wafer receiving areas 105, respectively. While the embodiment of FIG. 1 illustrates that four wafers are loaded on the substrate carrier device 100, it is merely for convenience of description. For example, if the substrate carrier device 100 increases in size, more substrates may be mounted thereon.

Structure of First Surface of Frame of Substrate Carrier Device 100

Clip mounting rods 106, 107, 108, and 109 vertically extending are installed in parallel to each other on opposing sides (e.g., left and right sides of wafer receiving areas 105) of the area on which the wafer substrate is disposed. For example, the plurality of clip mounting rods 106, 107, 108, and 109 may be vertically disposed along a longitudinal direction from a top to a bottom of a first surface of the device frame 101 to traverse the first surface. The number of the rods may be an even number.

The rods 106, 107, 108, and 109 may traverse the first surface of the device frame 101, and thus one end of the rods 106, 107, 108, and 109 may be fixed to lower end rod fixing parts and the other end of the rods 106, 107, 108, and 109 may be fixed to upper end rod fixing parts 110, 120, and 130. In detail, the upper and lower ends of the clip mounting rods may be inserted into holes defined in the fixing parts. Each of the rods may be rotated at a fixed position. Here, fixing means that the rod is not completely fixed but may move more or less left and right or up and down (hereinafter, the same meaning may be applied). The upper and lower ends of the rods may be rotated in the holes. A rotation angle is limited. A plurality of first clips are installed at predetermined positions on the surfaces of the rods 106, 107, 108, and 109. The positions on which the first clips are disposed may correspond to positions on which second clips to be described below are installed when using the wafer as a reference.

The upper end rod fixing parts 110, 120, and 130 may be disposed on the supporting unit 103 of the substrate carrier device 100. The supporting unit 103 may be disposed between a grip unit connecting the substrate carrier device 100 to the transfer device, and the device frame 101 in which the substrate is received. An electrical cable is provided for forming an electrode on the substrate through an electrical device for the electro-plating (not shown) and the rods.

Figure 2:
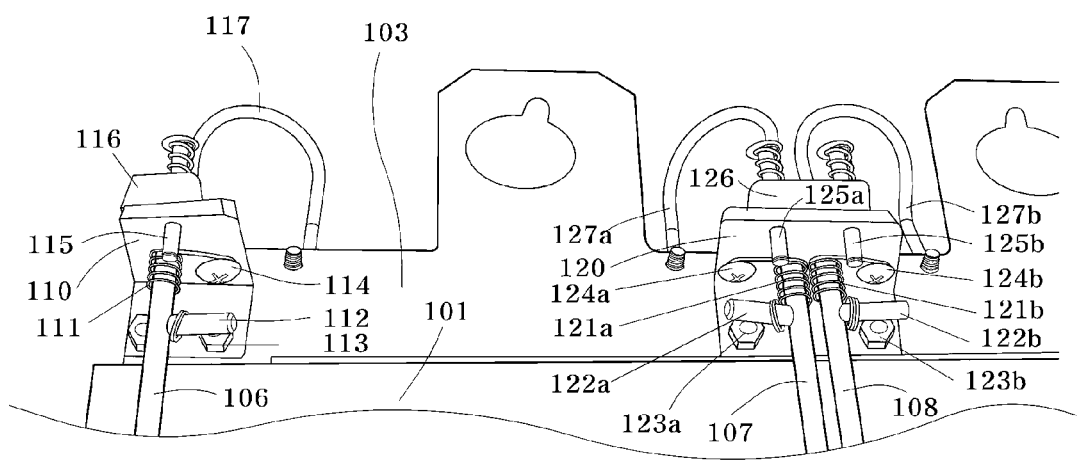
FIGS. 2 and 3 are enlarged views of an upper structure of the substrate carrier device 100 of FIG. 1.
Figure 3:
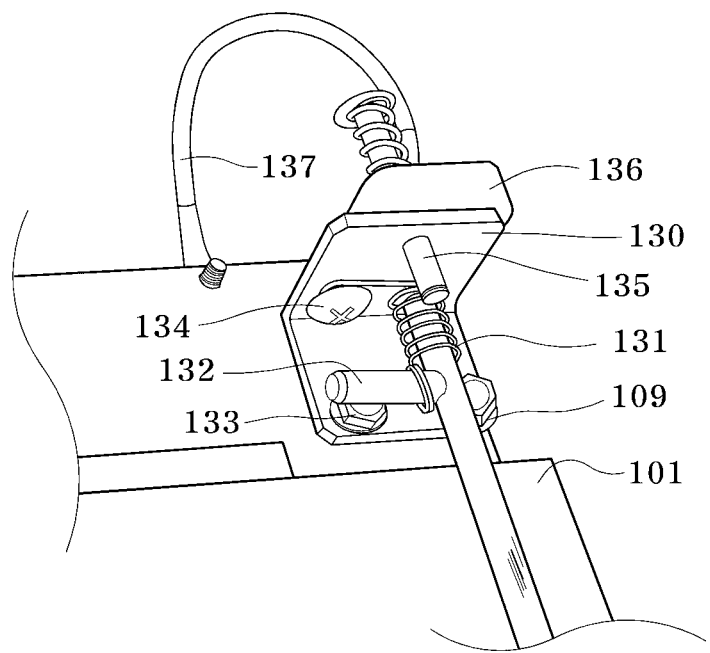

The upper end rod fixing parts 110, 120, and 130 are enlarged and illustrated in FIGS. 2 and 3. FIG. 2 illustrates a configuration example of the upper end rod fixing parts 110 and 120. First, the upper end rod fixing part 110 of FIG. 2 will be described. One end of the clip mounting rod 106 is inserted into and fixed to the hole (not shown) of the upper end rod fixing part 110. Rod holders 116, 126, and 136 may hold the rods on a back surface of the rod fixing part 110, 120, and 130.

A handle 112 which protrudes from a surface of the rod 106 is installed on a front side of a position in which the end of the rod 106 is connected to the upper end rod fixing part 110. The handle 112 may be supported on a fixing unit 113 which fixes the upper end rod fixing part 110 to a surface of the supporting unit 103 (when the clip is closed). The handle 112 may have various shapes and be modified in other shapes which are capable of being gripped by a mechanical device.

Also, a spring fixing part 114 may be installed on the upper end rod fixing part 110 as shown, a spring member 111 wound around and fixed to the spring fixing part 114 is tightly wound around from the end of the rod 106 to the handle 112. The spring member 111 is installed as described above so as to provide strong elastic supporting power generated from the spring to the substrate through each of the first clips 160 in a state where the clip is closed. In FIG. 2, the spring member 111 and the rod 106 are illustrated as if the spring member 111 is wound around the rod 106 without a close contact therebetween, however, it is merely for convenience of description. The spring member 111 is tightly wound around the spring fixing part 114 in a state where the spring member 111 closely contacts the rod 106.

Rod stoppers 115, 125*a*, 125*b*, and 135 may be provided to regulate or confine rotation positions of the rods 106, 107, 108, and 109, respectively. Reference numeral 117 indicates a conducting cable wire.

Two clip mounting rods 107 and 108 may be fixed to the upper end rod fixing part 120 at the same time. The spring member 121*a* is wound around a handle 122*a* and an end of the rod 107 and a spring fixing part 124*a*. Likewise, the spring member 121*b* is wound around a handle 122*b* and an end of the rod 108 and a spring fixing part 124*b*. As shown in FIG. 3, a spring member 131 is wound around a handle 132 and an end of the rod 109 and a spring fixing part 134.

FIGS. 2 and 3 are views illustrating a state where the clip is closed. The handles 112, 122*a*, and 122*b* are disposed on the fixing parts 113, 123*a*, and 123*b*, respectively, in a state where each of the clips is closed, and excessive power is applied to an edge portion of the substrate, thereby preventing the substrate from damaging. The handles 112, 122*a*, and 122*b* are manipulated to rotate the surfaces of the rods 106, 107, and 108, respectively, and thus the plurality of first clips 160 are displaced. Thus, open and close state of the clips 160 may be formed with respect to the substrate. Therefore, time required for loading and unloading the substrate may be effectively reduced.

Configuration of Wafer Receiving Area 105

Figure 4:
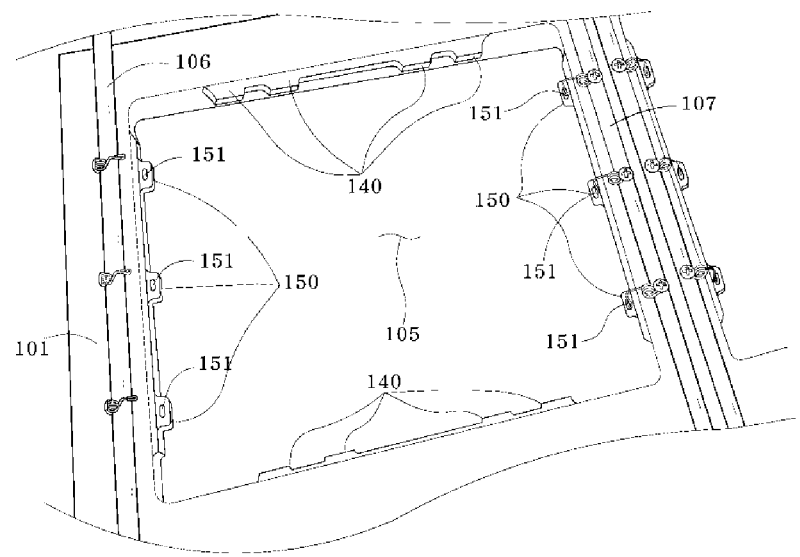
FIG. 4 is an enlarged view of a structure of a wafer receiving area 105 of the substrate carrier device 100 of FIG. 1.

FIG. 4 illustrates a configuration example of each of the wafer receiving areas 105. The wafer receiving area 105 may have approximately a rectangular opening shape and accommodate the wafer (not shown). The wafer receiving area 105 may have top and bottom elements symmetric with respect to left and right elements therein. The top and bottom elements may support upper and lower end portions of the wafer, and the left and right elements may support left and right end portions of the wafer and also form an electrode on the wafer.

Figure 9:
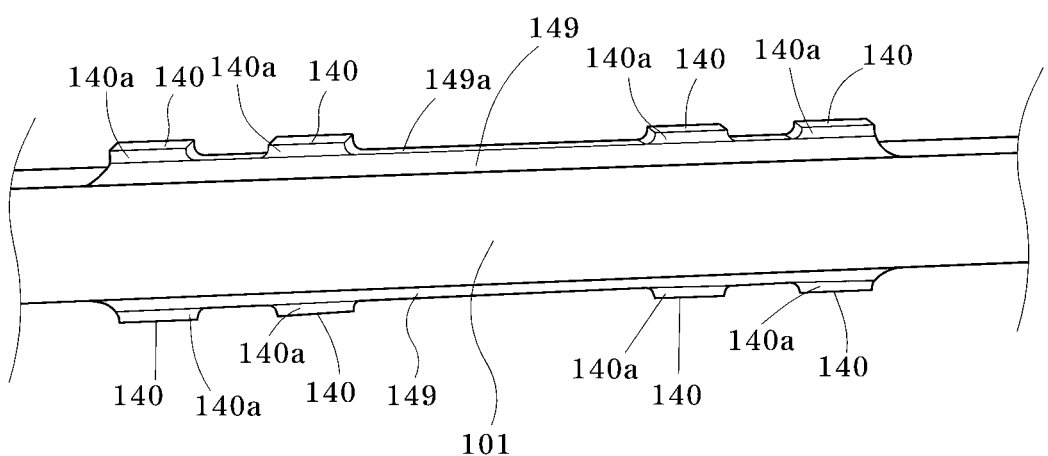
FIG. 9 is a view illustrating a structure of a first protrusion support part 140 of FIG. 1.

The elements supporting the wafer may be formed on a protrusion base (e.g., reference numeral 159 of FIG. 5 and reference numeral 149 of FIG. 9) protruding inward from an edge of the wafer receiving area 105. The protrusion base may have an inclined surface obliquely inclined toward the wafer receiving area from the surface of the device frame 101. The inclined surface may guide the wafer so that when the wafer is mounted, the water may be easily guided toward the wafer receiving area 105. First and second protrusion supporting parts 140 and 150 for supporting the edge of the wafer received in the wafer receiving area 105 are formed on the protrusion bases 159 and 149.

A plurality of second protrusion supporting parts 150 for forming a plurality of electrodes are formed on the protrusion bases 159 disposed on left and right sides of the wafer receiving area 105. The second protrusion supporting parts 150 protrude from the protrusion base 159 toward the inside of the wafer receiving area 105, and holes 151 defined therein, respectively. An opposite clip, that is a second clip 170 passes through the hole 151. When the wafer is disposed on the wafer receiving area 105, the second clip 170 that has passed through the hole 151 forms a contact point on an opposite surface of the wafer. The first clip 160 may form a contact point on the surface of the wafer in a state where the clip is closed due to a rotational movement of the clip mounting rod above the surface of the wafer. The plurality of second protrusion supporting parts 150 may support the left and right sides of the wafer and simultaneously form electrodes on both surfaces of the wafer.

A plurality of first protrusion supporting parts 140 for supporting the wafer substrate are formed on the upper and lower protrusion bases of the wafer receiving area 105. Each of the first protrusion supporting parts 140 may support the upper and lower edges of the wafer. The configuration of the first protrusion supporting part 140 is illustrated in more detail in FIG. 9. The upper and lower ends of the wafer may be disposed on surfaces 140*a* of the first protrusion supporting parts 140 formed at the upper and lower sides of the wafer receiving area 105.

First and Second Clips 160 and 170

Figure 5:
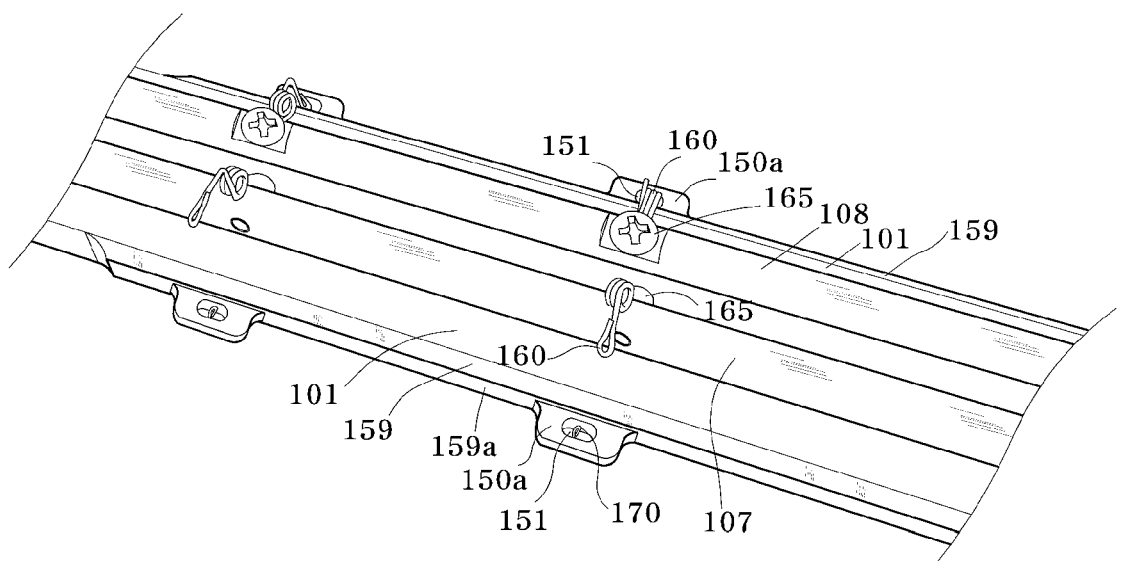
FIG. 5 is an enlarged view illustrating a relationship between a second protrusion support part 150 and a first clip 160.

FIG. 5 illustrates a relationship between the second protrusion supporting part 150 and a first clip 160 in more detail.

As shown, a second clip 170 installed on a back side of the substrate carrier device 100 is inserted through the hole 151 of the second protrusion supporting part 150. An end of the second clip 170 passes through the hole 151 to protrude a little higher than the surface 150*a* of the second protrusion supporting part 150. This is to form a contact point with a wafer. If the end of the second clip 170 is disposed below the surface 150*a* of the second protrusion supporting part 150, the contact point with the wafer may not be formed. For example, a deviation between a position of the end of the second clip 170 and the surface 150*a* of the protrusion supporting part 150 may be about 0.1 mm.

The first clip 160 forming a contact point with the wafer to form an electrode may be mounted on the surface of the clip mounting rod 107 by a screw type clip fixing unit 165. After the wafer is loaded on the wafer receiving area 105 of the substrate carrier device 100, when an electroplating process is performed, the first clip 160 may be located downward toward the hole 151 of the second supporting part 150. When the location of the hole 151 of the second protrusion support part 150 is used as a reference, the second clip 170 passing through the hole 151 from the back surface of the frame and the first clip 160 coming from a front side of the frame are symmetrical to each other with the wafer being disposed therebetween. The first and second clips 160 and 170 are installed in the same direction when a normal line direction to the surface of the wafer is used as a reference.

Figure 8:
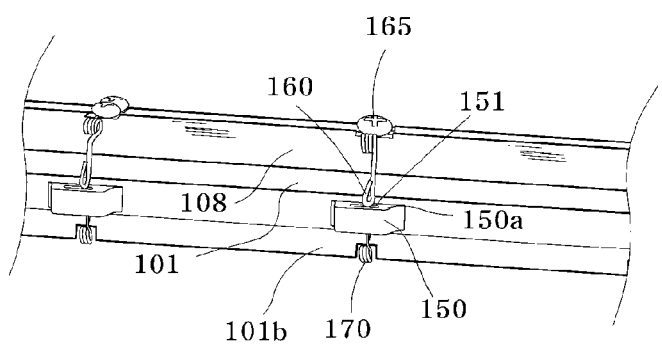
FIG. 8 is a view illustrating a state where the clip is closed according to an exemplary embodiment of the present invention.

FIG. 5 illustrates a state where the clip is opened on the rod 107, and FIG. 8 illustrates an example of the state where the clip is closed. In FIG. 8, it is illustrated as if the first clip 160 disposed in the front side of the substrate carrier device 100 directly contacts the surface 150a of the second protrusion supporting part 150. However, since the wafer is disposed on the surface 150a, the first clip 160 contacts a first surface of the wafer, and the second clip 170 contacts a second surface of the wafer on the back side of the frame. Thus, a double-side electroplating may be performed.

The clips 160 and 170 may be formed of a conductive metal and have a spring shape wound around several times. The clips 160 and 170 may be configured as a spring as shown, thereby maintaining a predetermined pressure on the surface of the wafer. Through the repeated loading and unloading process of the wafer substrate, fatigue of the clip member may increase. As a result, an irregular pressure may be applied to the surface of the wafer. However, the clips 160 and 170 may be formed in a spring shape, and thus, physical properties of the clip member may be maintained for a long time in spite of repeated processes. Also, each of the ends of the clips 160 and 170 may be doubly bent in a U-shape, thereby preventing the surface of the wafer from damaging due to a contact between the clips 160 and 170 and the wafer.

Configuration of Second Surface of Frame of Substrate Carrier Device 100

Figure 6:
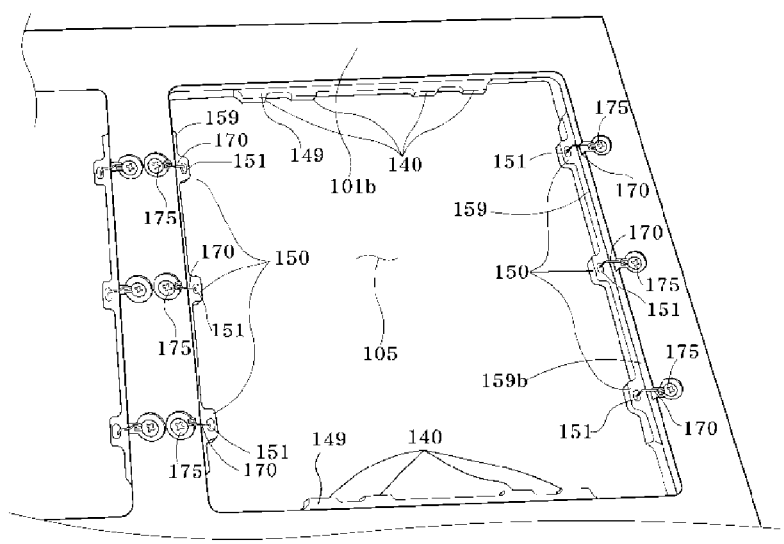
FIG. 6 is a view illustrating an example of a back surface of the substrate carrier device 100 around the wafer receiving area 105.

FIG. 6 is a view illustrating an example of a configuration of the back surface of the substrate carrier device 100 of the present invention. The first clip 160 installed on the front surface is disposed on each surface of the clip mounting rods 106, 107, 108, and 109. The wafer is loaded on and unloaded from the front surface of the substrate carrier device 100 by movements of the rods 106, 107, 108, and 109. The movements of the rods 106, 107, 108, 109 may create the states where the clips 160 are opened and closed. When the clip is opened, the wafer is loaded on or unloaded from the substrate carrier device 100, and when the clip is closed, the electroplating is performed. Through this operation, an electrode of a first surface of the wafer may be formed. Since the loading/unloading of the wafer is performed at the front of the substrate carrier device 100, a configuration such as the clip mounting rod does not exist on the back surface of the substrate carrier device 100.

Therefore, the second clip 170 which functions to form an electrode on the second surface of the wafer may be directly fixed to the back surface 101b of the device frame by using a screw type clip fixing unit 175. An electrode of a second surface of the wafer may be formed by the second clip 170. When the wafer is loaded on the substrate carrier device 100, the first and second surfaces of the wafer form contact points with the clips 160 and 170 at the same time. Then, the substrate carrier device 100 may be vertically immersed in an electroplating bath to plate both surfaces of the wafer substrate at the same time.

Figure 7:
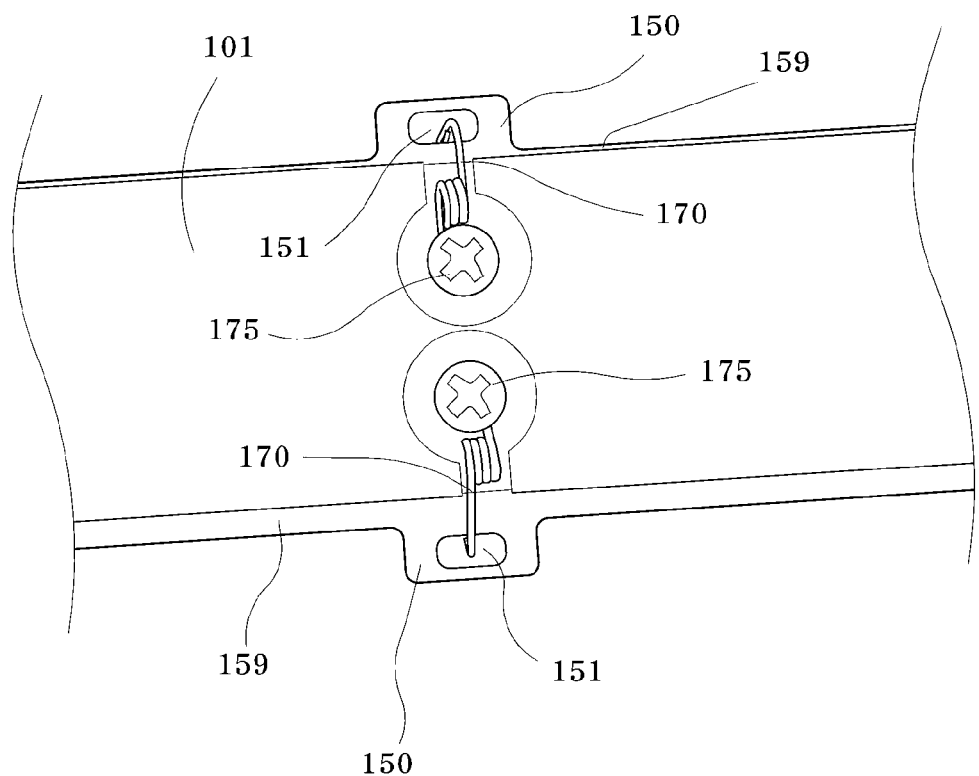
FIG. 7 is an enlarged view of a clip portion of FIG. 6.

An example of the configuration of the clip 170 of FIG. 6 will be described in more detail in FIG. 7. The second clip 170 forming the electrode on the second surface (the back surface) of the wafer and the first clip 160 forming the electrode on the first surface (the front surface) of the wafer may have the same structure.

As described above, the contact portions between the clips 160 and 170 and the wafer are doubly bent. Thus, the substrate may be prevented from being damaged even when sharp tips of the clips 160 and 170 contact the surface of the substrate. If a contact area between the clips 160 and 170 and the surface of the substrate is excessively wide, a non-plating phenomenon may occur. However, as in the embodiment of the present invention, since the contact portions of the clips 160 and 170 with the wafer are doubly bent, the substrate may be prevented from being damaged and the non-plating phenomenon may be minimized.

The surfaces of the clips 160 and 170 may be coated with Teflon, resin, or the like, including acid-resistant and alkali-resistant epoxy.

A series of processes for manufacturing a solar cell may be performed by an automation system. Also, the process of loading the wafer substrate on and unloading the wafer substrate from the substrate carrier device 100 for the electroplating may be performed by an automation system. Otherwise, time and efforts required for the electroplating may negatively affect the price of the solar cell.

To load and unload the wafer substrate on/from the substrate carrier device 100, it is important that each of the clips 160 and 170 is opened and closed at the same time. The present invention is advantageous in that the clips 160 are disposed in parallel at the same position at the front of the substrate carrier device 100, the position on which the clips 160 are arranged has only a linear element and has no bending in different directions, and the clip closing and clip opening by using the clip mounting rods 106, 107, 108, and 109 are performed by the whole clips at the same time, and thereby loading and unloading the wafer on/from the substrate automatically.

Other Exemplary Embodiments

1. In the drawings, the dimensions of layers and regions are exaggerated for clarity. When the substrate carrier device 100 of the present invention is applied to the real site, the dimension of each of the elements may be changed or modified according to designs and applications, and may be selected as an optimal value.

2. The elements of the device frames of the present invention may be formed of a synthetic resin such as chlorinated polyvinyl chloride (CPVC), perfluoroalkoxy (PFA), polypropylene, polyethylene, and the like.

Therefore, the scope of embodiments of the present invention is not limited to the specific embodiments. Also, it will be understood that the embodiments disclosed in this specification includes some variations without limitations to the shapes as illustrated in the figures. Therefore, the exemplary embodiments of the present invention were described in detail with reference to the accompanying drawings. The description of the present invention is intended to be illustrative, and those with ordinary skill in the technical field of the present invention pertains will be understood that the present invention can be carried out in other specific forms without changing the technical idea or essential features

The invention claimed is:

1. A substrate carrier device for electroplating of a solar cell which simultaneously plates both surfaces of a wafer, the device comprising:
   a frame in which a substrate is received;
   a supporting part connected to a transfer device;
   a wafer receiving area having an opening-shaped area defined in the frame and supporting an edge of the wafer to be received through a plurality of first protrusion supporting parts and a plurality of second protrusion parts which are formed on an edge of the frame; at least two clip mounting rods vertically mounted to traverse a first surface of the frame at left and right sides of the wafer receiving area to control a clip opening (forming a contact point with the wafer) and a clip closing (releasing a contact point with the wafer) while rotating at a fixed position;
   a plurality of first clips installed spaced apart by a predetermined distance from each other on the clip mounting rod, opening and closing of the plurality of first clips being determined by a rotation of the clip mounting rod; and a plurality of second clips installed around the wafer receiving area on a second surface of the frame to pass through a hole defined in the second protrusion supporting part and having ends disposed higher than a surface of the second protrusion supporting part.

2. The device of claim 1, further comprising a base on which the first and second protrusion supporting parts are formed, wherein the base further comprises an inclined surface formed from the frame toward the wafer receiving area to guide the wafer to the wafer receiving area through the inclined surface when the wafer is loaded on the substrate carrier device.

3. The device of claim 1, wherein upper ends of the clip mounting rods are inserted into holes defined in upper end rod fixing parts and lower ends of the clip mounting rods are inserted into holes defined in lower end rod fixing parts, and
the upper ends are connected to the upper end rod fixing parts by spring members and clip opening and clip closing of the clip mounting rods are manipulated by using elastic power of the spring member.

4. The device of claim 3, wherein handles for controlling a movement of the clip mounting rods are installed on the upper ends of the clip mounting rods, respectively, and the spring member is tightly wound around from the upper ends of the clip mounting rods to the handles.

5. The device of claim 1, wherein portions in which the first and second clips form the contact points with the wafer are doubly bent to have a U-shape.

6. The device of claim 1, wherein positions in which the first and second clips form contact points with the wafer are disposed in the same normal line direction when the surface of the wafer is used as a reference.

7. A substrate carrier device for electroplating surfaces of a wafer, comprising:
a frame structured to include first and second surfaces on opposing sides of the frame, at least one opening area in the frame penetrating through the first and second surfaces to form a wafer receiving area within the frame, and first and second protrusion supporting parts on edges of the wafer receiving area within the frame, the wafer receiving area structured to support an edge of a wafer to be received by the first and second protrusion supporting parts and each second protrusion supporting part including a hole;
a supporting part engaged to the frame for engaging to a transfer device;
two clip mounting rods located at opposing sides of the wafer receiving area, respectively, and mounted to allow rotation of the two clip mounting rods to control a clip opening to form a contact point with the wafer and to control a clip closing to release the contact point with the wafer;
a plurality of first clips on the clip mounting rods to be above or near the first surface and spaced apart by a predetermined distance from one another on each clip mounting rod, the first clips being rotated by a rotation of a respective clip mounting rod between a clip opening position and a clip closing position; and
a plurality of second clips installed around the wafer receiving area on the second surface of the frame, each second clip positioned to pass through a hole of a respective second protrusion supporting part and having ends disposed higher than a surface of the second protrusion supporting part.

8. The device of claim 7, further comprising a base on which the first and second protrusion supporting parts are formed, wherein the base further comprises an inclined surface formed from the frame toward the wafer receiving area to guide the wafer to the wafer receiving area through the inclined surface when the wafer is loaded on the substrate carrier device.

9. The device of claim 7, comprising:
rod fixing parts on the frame and having holes into which the clip mounting rods are inserted, and
spring members engaged to the rod fixing parts and the clip mounting rods to provide a spring force for controlling opening or closing of the first clips caused by rotation of the clip mounting rods.

10. The device of claim 9, comprising handles for controlling a movement of the clip mounting rods that are installed on the clip mounting rods, respectively, and each spring member is tightly wound around a respective clip mounting rods to the handles.

11. The device of claim 7, wherein portions in which the first and second clips form the contact points with the wafer are doubly bent to have a U-shape.

12. The device of claim 7, wherein positions in which the first and second clips form contact points with the wafer are disposed in the same normal line direction when the surface of the wafer is used as a reference.

13. A substrate carrier device for electroplating surfaces of one or more wafers by holding and positioning the one or more wafers in a bath of a plating solution, comprising:
a frame structured to include one or more opening areas in the frame so that each opening area forms a wafer receiving area within the frame to receive one wafer for electroplating surfaces of each received wafer in the bath of the plating solution,
wherein each wafer receiving area includes:
two clip mounting rods located at opposing sides of each wafer receiving area, respectively and mounted at respective fixed positions to allow rotation of the two clip mounting rods;
first clips engaged to the two clip mounting rods spaced apart by a predetermined distance from one another on each clip mounting rod, wherein positions of the first clips can be changed by a rotation of a respective clip mounting rod between a clip opening position and a clip closing position; and
second clips installed on edges of each wafer receiving area, wherein first and second clips collectively operate to hold a received wafer in position within each wafer receiving area to expose the two opposite surfaces of each received wafer to the bath of the plating solution.

* * * * *